US008773209B2

(12) United States Patent
Chen

(10) Patent No.: US 8,773,209 B2
(45) Date of Patent: Jul. 8, 2014

(54) FREQUENCY GENERATING SYSTEM, VOLTAGE-CONTROLLED OSCILLATOR MODULE AND METHOD FOR ADJUSTING SIGNAL FREQUENCY

(71) Applicant: Phison Electronics Corp., Miaoli (TW)

(72) Inventor: Wei-Yung Chen, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/646,744

(22) Filed: Oct. 8, 2012

(65) Prior Publication Data

US 2014/0049303 A1 Feb. 20, 2014

(30) Foreign Application Priority Data

Aug. 15, 2012 (TW) .............................. 101129550 A

(51) Int. Cl.
*H03K 3/03* (2006.01)
(52) U.S. Cl.
USPC .............................. 331/57; 331/109; 331/185
(58) Field of Classification Search
USPC ...................... 331/109, 183, 15, 185, 186, 57
See application file for complete search history.

(56) References Cited

U.S. PATENT DOCUMENTS

| 6,556,088 | B1 * | 4/2003 | Dietl et al. ...................... 331/17 |
| 7,639,093 | B2 * | 12/2009 | Ardehali ......................... 331/57 |
| 7,750,744 | B2 * | 7/2010 | Clements et al. ............... 331/57 |
| 7,907,018 | B2 * | 3/2011 | Pellerano et al. .............. 331/16 |
| 7,969,253 | B2 * | 6/2011 | Shiah et al. ................... 331/185 |
| 7,990,225 | B1 * | 8/2011 | Guo et al. ...................... 331/17 |

* cited by examiner

*Primary Examiner* — Joseph Chang
(74) *Attorney, Agent, or Firm* — Jianq Chyun IP Office

(57) ABSTRACT

A voltage controlled oscillator module including a VCO unit and a gain adjustment unit is provided. The VCO unit is configured to generate a frequency signal based on a control voltage. The gain adjustment unit is coupled to the VCO unit and configured to receive a first adjustment voltage, a second adjustment voltage, and a reference voltage and accordingly adjusts the control voltage to adjust a frequency value of the frequency signal. The gain adjustment unit includes an adjustment circuit unit and a reference circuit unit. A first voltage-frequency curve of the frequency value of the frequency signal and a voltage value of the first adjustment voltage changes in response to a structure characteristic of the adjustment circuit unit. Furthermore, a frequency generating system and a method for adjusting a signal frequency of the VCO module are provided.

24 Claims, 6 Drawing Sheets

FREQUENCY GENERATING SYSTEM, VOLTAGE-CONTROLLED OSCILLATOR MODULE AND METHOD FOR ADJUSTING SIGNAL FREQUENCY

CROSS-REFERENCE TO RELATED APPLICATION

This application claims the priority benefit of Taiwan application serial no. 101129550, filed on Aug. 15, 2012. The entirety of the above-mentioned patent application is hereby incorporated by reference herein and made a part of this specification.

BACKGROUND

1. Technical Field

The disclosure is related to a frequency generating circuit and a method for adjusting signal frequency thereof, and is particularly related to a voltage-controlled oscillator module, and a method for adjusting signal frequency and a frequency generating system thereof.

2. Background

Referring to FIG. 1, FIG. 1 is a detailed circuit diagram illustrating a conventional voltage-controlled oscillator. A voltage-controlled oscillator (VCO) 110 is implemented based on a ring oscillator 110, which is controlled by a control voltage Vctrl to generate a frequency signal fout. The control voltage Vctrl is output through a unit gain buffer 120 to drive the ring oscillator 110. A unit delay device 112 at each stage of the ring oscillator is an inverter implemented by utilizing a P-type or N-type metal oxide semiconductor transistor. Generally speaking, the unit delay device 112 at each stage of the ring oscillator 110 is very sensitive to a change of the control voltage Vctrl. Therefore, once the control voltage Vctrl slightly changes, a frequency value of the frequency signal fout changes drastically. The characteristic renders the ring oscillator 110 having a larger gain. The gain referred herein indicates a ratio between the frequency value of the frequency signal fout and the voltage value of the control voltage Vctrl, which may be illustrated with a voltage-frequency curve.

Generally speaking, the voltage control oscillator 100 may be applied at different signal transmission interfaces. In correspondence to different signal transmission interfaces, the voltage-controlled oscillator 100 has to provide the frequency signal fout having a corresponding frequency value. The frequency value of the frequency signal fout may be adjusted by adjusting a gain and bias points of the ring oscillator 110. In the conventional art, the gain and bias points of the ring oscillator 110 are adjusted by changing a structure characteristic of the unit gain buffer. However, changing the structure characteristic of the unit gain buffer may render other issues, such as the gain of the ring oscillator being hard to adjust, a larger gain of the ring oscillator rendering a larger noise, and the control voltage Vctrl having a smaller dynamic range and an operating point not set at center of the gain curve. In addition, in some examples, an operational amplifier serving as the unit gain buffer 120 consumes more power to maintain operation with high current density, high bandwidth, and low noise. Therefore, it is necessary to provide a voltage-controlled oscillator whose signal frequency may be adjusted with different transmission interfaces.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The disclosure provides a voltage-controlled oscillator module, whose signal frequency may be adjusted according to a transmission interface to which the voltage-controlled oscillator module is coupled.

The disclosure provides a method for adjusting signal frequency, which may adjust a frequency value according to a transmission interface to which a circuit module is coupled.

The disclosure provides a frequency generating system, which may adjust a frequency value according to a transmission interface to which the frequency generating system is coupled.

The disclosure provides a voltage-controlled oscillator module, including a voltage-controlled oscillator unit and a gain adjustment unit. The voltage-controlled oscillator unit is configured to generate a frequency signal according to a control voltage. The gain adjustment unit is coupled to the voltage-controlled oscillator unit and configured to receive a first adjustment voltage, a second adjustment voltage, and a reference voltage, thereby adjusting the control voltage to adjust a frequency value of the frequency signal. The gain adjustment unit includes an adjustment circuit unit and a reference circuit unit. The adjustment circuit unit is coupled to a unit voltage receiving end for receiving a unit voltage and configured to receive the first adjustment voltage or the second adjustment voltage, so as to adjust the control voltage. The reference circuit unit is coupled to the adjustment circuit unit and configured to receive the reference voltage, thereby adjusting the control voltage to reduce an influence of noise of the unit voltage on the frequency signal.

The disclosure provides a method for adjusting signal frequency of a voltage-controlled oscillator module. The voltage-controlled oscillator module includes an adjustment circuit unit. The adjustment circuit unit is coupled to a unit voltage. The method for adjusting signal frequency includes the following steps. A first adjustment voltage, a second adjustment voltage, and a reference voltage are received. A control voltage is controlled according to at least one of the first adjustment voltage and the second adjustment voltage. The control voltage is adjusted according to the reference voltage, thereby reducing an influence of noise of the unit voltage on a frequency signal. The frequency signal is generated according to the control voltage.

The disclosure provides a frequency generating system, including a phase-locked loop and a control signal generation unit. The phase-locked loop is configured to generate a frequency signal according to a reference frequency and a feedback signal, and output the frequency signal as the feedback signal. The phase-locked loop includes a voltage-controlled oscillator module that receives a first adjustment voltage generated inside the phase-locked loop. The control signal generation unit is coupled to the phase-locked loop and configured to provide a second adjustment voltage to the voltage-controlled oscillator module according to a up signal and a down signal of the phase-locked loop. The voltage-controlled oscillator module is configured to generate a frequency signal according to a control voltage. In addition, the voltage-controlled oscillator module receives a first adjustment voltage, a second adjustment voltage, and a reference voltage, thereby adjusting the control voltage to adjust a frequency value of the frequency signal. The voltage-controlled oscillator module includes at least one adjustment circuit unit. The adjustment circuit unit is coupled to a unit voltage receiving end for receiving a unit voltage and configured to receive the first adjustment voltage or the second adjustment voltage, so as to adjust the control voltage.

Based on the above, in the exemplary embodiments of the disclosure, the voltage-frequency curve between the frequency signal and adjustment voltage changes in response to the structure characteristic of the adjustment circuit unit. Therefore, the voltage-controlled oscillator module may adjust the frequency value of the frequency signal according to different transmission to which the voltage-controlled oscillator is coupled by using the adjustment voltage.

These and other exemplary embodiments, features, aspects, and advantages of the invention will be described and become more apparent from the detailed description of exemplary embodiments when read in conjunction with accompanying drawings.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
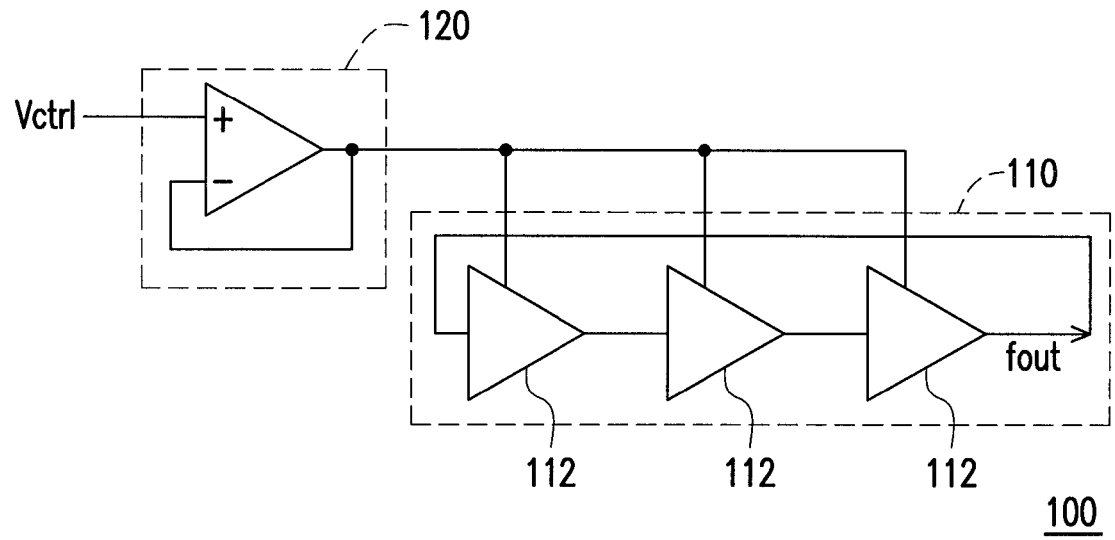
FIG. 1 is a detailed circuit diagram illustrating a conventional ring oscillator.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2A:
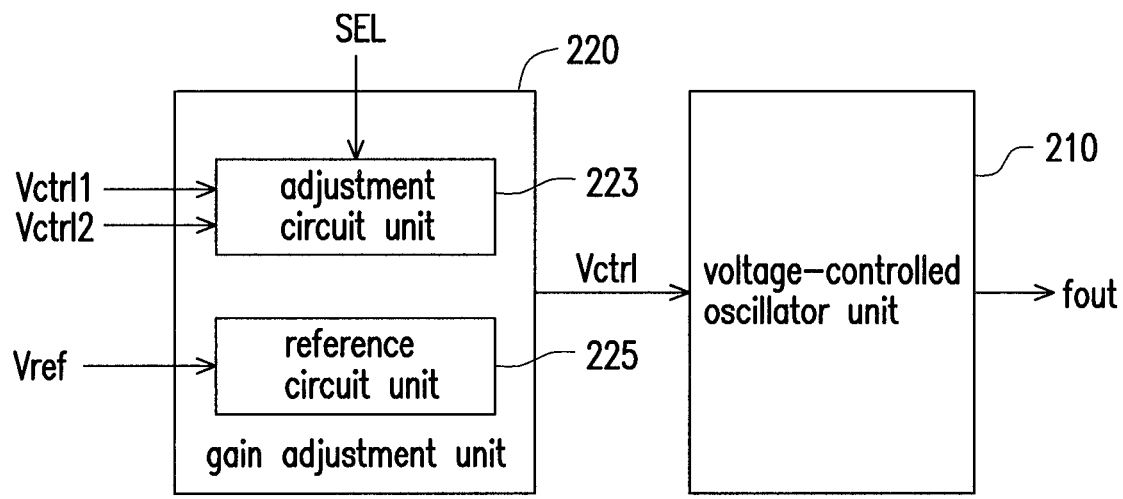
FIG. 2A is a detailed diagram illustrating a voltage-controlled oscillator module according to an embodiment of the disclosure.
Figure 2B:
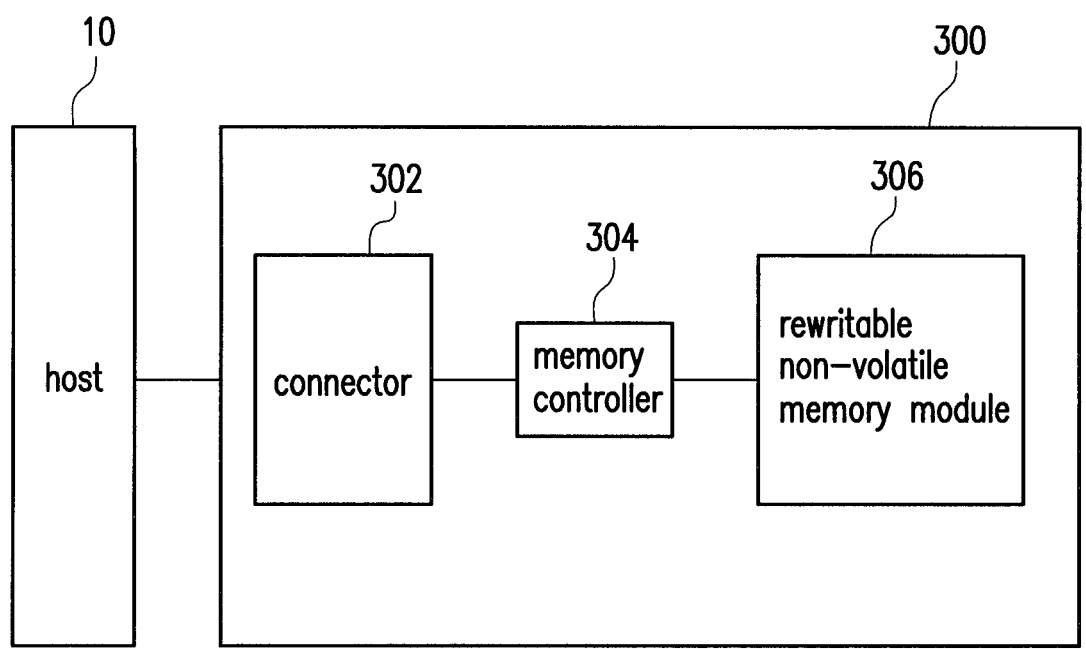
FIG. 2B is a detailed block diagram illustrating a memory storage device that is coupled to a host.

FIG. 2A is a detailed diagram illustrating a voltage-controlled oscillator module according to an embodiment of the disclosure. FIG. 2B is a detailed block diagram illustrating a memory storage device coupled to a host. As shown in FIGS. 2A and 2B, a memory storage device 300 includes a connector 302, a memory controller 304, and a rewritable non-volatile memory module 306. In practice, a voltage-controlled oscillator 200 is configured in the connector 302 inside the memory storage device 300, and is coupled to a host 10 through a transmission interface, for example. In this embodiment, the voltage-controlled oscillator 200 adjusts a frequency value of the frequency signal fout according to a first adjustment voltage Vctrl1 or a second adjustment voltage Vctrl2. In addition, the voltage-controlled oscillator module 200 selects the first adjustment voltage Vctrl1 or the second adjustment voltage Vetrl2 as the basis to adjust the frequency value of the frequency signal fout in correspondence to different types of transmission interface.

In the exemplary embodiment, the transmission interface between the host 10 and the connector 302 is compatible with a standard of serial advanced technology attachment (SATA). However, it shall be appreciated that the disclosure is not limited thereto. The transmission interface between the host 10 and the connector 302 may also be compatible with a standard of Institute of Electrical Electronic Engineer (IEEE) 1394, peripheral component interconnect express (PCI Express), universal serial bus (USB), secure digital (SD) interface, memory stick (MS) interface, multimedia card (MMC) interface, compact flash (CF) interface, integrated device electronics (IDE), or other suitable standards.

The memory storage controller 304 executes a plurality of logic gates or control commands which are implemented in a hardware form or in a firmware form, so as to perform operations of writing, reading or erasing data in the rewritable non-volatile memory module 306 according to commands of the host 10.

The rewritable non-volatile memory module 306 is coupled to the memory controller 304 and stores a data written by the host 10. In the exemplary embodiment, the rewritable non-volatile memory module 306 is a multi-level cell (MLC) NAND flash memory module. However, the disclosure is not limited thereto. The rewritable non-volatile memory module 306 may also be a single-level cell (SLC) NAND flash memory module, other rewritable non-volatile memory modules, or other memory modules having the same characteristic.

Therefore, in one embodying configuration of the disclosure, the voltage-controlled oscillator module 200 selects the first adjustment voltage Vctrl1 to adjust the frequency value of the frequency signal fout at a low frequency, whereas the voltage-controlled oscillator module 200 the second adjustment voltage Vetrl2 to adjust the frequency value of the frequency signal fout at a high frequency in practice. Namely, when the memory storage device 300 is coupled to different hosts, the memory controller 304 may select an appropriate adjustment voltage in correspondence to different transmission interfaces of different hosts.

More specifically, referring to FIG. 2A, the voltage-controlled oscillator module 200 includes a voltage-controlled oscillator unit 210 and a gain adjustment unit 220. The voltage-controlled oscillator unit 210 generates a frequency signal fout according to a control voltage Vctrl. The gain adjustment unit 220 is coupled to the voltage-controlled oscillator unit 210 and includes an adjustment circuit unit 223 and a reference circuit unit 225. The adjustment circuit unit 223 is configured to receive the first adjustment voltage Vctrl1 and the second adjustment voltage Vctrl2, whereas the reference circuit unit 225 is configured to receive a reference voltage Vref. Thereby, the gain adjustment unit 220 adjusts the control voltage Vctrl to adjust the frequency value of the frequency signal fout. In this embodiment, at least one adjustment transistor is included within the adjustment circuit unit 223. A ratio between the frequency value of the frequency signal fout and a voltage value of the first adjustment voltage Vctrl1 changes in response to a structure characteristic of the adjustment transistor. In addition, the ratio in the exemplary embodiment is also termed as a first voltage-frequency curve. In this exemplary embodiment, the adjustment transistor may be a metal oxide semiconductor field effect transistor. In another exemplary embodiment, the adjustment transistor may also be a junction field effect transistor, a field effect transistor, a bipolar transistor, or other kinds of transistor. In addition, in this exemplary embodiment, the structure characteristic may indicate a width-to-length ratio of channel of the metal oxide semiconductor field effect transistor. Therefore, the first voltage-frequency curve of this embodiment indicates the ratio between the frequency value of the frequency signal fout and the voltage value of the first adjustment voltage Vetrl1, and may be deem as a first gain of the voltage-controlled oscillator module 200. In addition, a ratio between the frequency value of the frequency signal fout and a voltage value of the second adjustment voltage Vetrl2 also changes in response to the structure characteristic of the adjustment transistor. Moreover, the ratio in the exemplary embodiment is also termed as a second voltage-frequency curve. Therefore, the second voltage-frequency curve indicates the ratio between the frequency value of the frequency signal fout and the voltage value of the second adjustment voltage Vctrl2, and may be deem as a second gain of the voltage-controlled oscillator module 200. In the exemplary embodiment described hereinafter, the structure characteristic of the adjustment transistor is exemplified as the width-to-length ratio of channel of the metal oxide semiconductor field effect transistor. However, the disclosure is not limited thereto.

Figure 3:
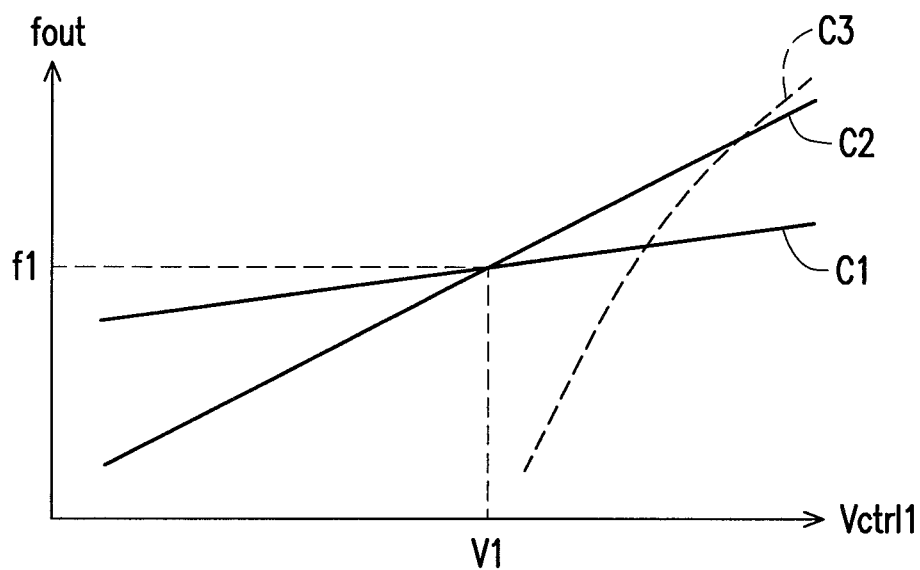
FIGS. 3 and 4 respectively illustrate voltage-frequency curves of the voltage-controlled oscillator module of FIG. 2A corresponding to different adjustment voltages.
Figure 4:
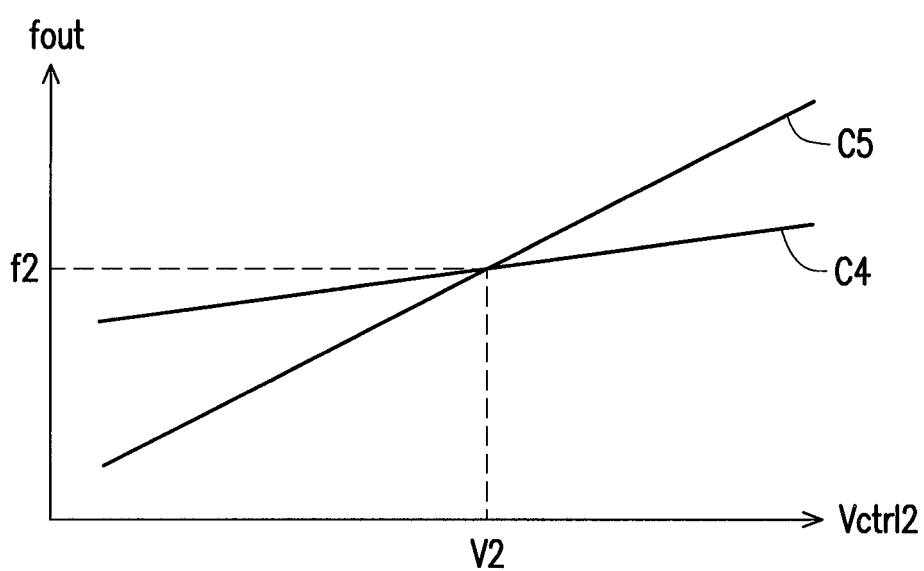

FIGS. 3 and 4 respectively illustrate voltage-frequency curves of the voltage-controlled oscillator module of FIG. 2A corresponding to different adjustment voltages. Referring to FIGS. 2A to 4, in FIG. 3, curves C1 and C2 in unbroken lines are the voltage-frequency curves of adjustment transistors configured in the adjustment circuit unit 223 and having different width-to-length ratios of channel that correspond to the first adjustment voltage Vctrl1, whereas a curve C3 in a broken line is a voltage-frequency curve according to a frequency value and a voltage value of the conventional ring oscillator 110. It can be seen from FIG. 3 that although the conventional voltage-frequency curve C3 has a steeper slope, the conventional voltage-frequency curve C3 has a narrow dynamic range and an operating point located at a side with a higher voltage value. Therefore, once the control voltage Vctrl of FIG. 1 slightly changes, the corresponding frequency value changes drastically, which is not preferable in circuit operation in practice. In the exemplary embodiment, the voltage-frequency curve C1 has a wider dynamic rage and an operating point that may be set on the curve that is closer to the middle of the voltage value based on a setting of the first adjustment voltage Vctrl. In addition, the voltage-frequency curve C1 has a less steep slope and flatter change. Also, the frequency value of the frequency signal fout does not change drastically as the first adjustment voltage Vctrl1 changes. In this embodiment, a designer may design the width-to-length ratio of channel of the adjustment transistor to change the slope of the voltage-frequency curve C1 of the frequency value of the frequency signal fout and the voltage value of the first adjustment voltage Vctrl1 to meet design needs in practice. Therefore, if the design of the width-to-length ratio of channel of the adjustment transistor within the adjustment circuit unit 223 becomes different, the voltage-frequency curve corresponding to the first adjustment voltage Vctrl1 changes to the voltage-frequency curve C2 accordingly. Similar to the characteristics of the voltage-frequency curve C1, the voltage-frequency curve C2 also includes the characteristics such as a wider dynamic range, an operating point that may be set at middle of the curve, and a flat change of curve. In this embodiment, a first voltage value V1 of the first adjustment voltage Vctrl1 reflects a first frequency value f1 of the frequency signal fout through the voltage-frequency curve C1 or C2. This is to say that the voltage-frequency curves C1 and C2 have at least one intersecting point. In addition, the voltage-frequency curves C1 and C2 corresponding to the first adjustment voltage Vctrl1 are termed as a first voltage-frequency curve.

As for FIG. 4, curves C4 and C5 in unbroken lines are voltage-frequency curves of adjustment transistors configured in the adjustment transistor unit 223 and having different width-to-length ratios that correspond to the second adjustment voltage Vctrl2. In this embodiment, a designer may also design the width-to-length ratio of channel of the adjustment transistor according to design needs in practice, so as to change the slope of the voltage-frequency curve C4 of the frequency value of the frequency signal fout and the voltage value of the second adjustment voltage Vctrl2. Therefore, if the design of the width-to-length ratio of channel of the adjustment transistor within the adjustment transistor unit 223 becomes different, the voltage-frequency curve corresponding to the second adjustment voltage Vctrl2 changes to the voltage-frequency curve C5 accordingly. Similar to the characteristics of the voltage-frequency curves C1 and C2, the voltage-frequency curves C4 and C5 also include characteristics such as a wider range, an operating point that may be set at middle of the curve, and a flat change of curve. In this embodiment, a second voltage value V2 of the second adjustment voltage Vctrl2 reflects a second frequency f2 of the frequency signal fout through the voltage-frequency curve C4 or C5. This is to say that the voltage-frequency curves C4 and C5 have at least one intersecting point. In addition, the voltage-frequency curves C4 and C5 corresponding to the second adjustment voltage Vctrl2 are termed as a second voltage-frequency curve in the disclosure.

Figure 5:
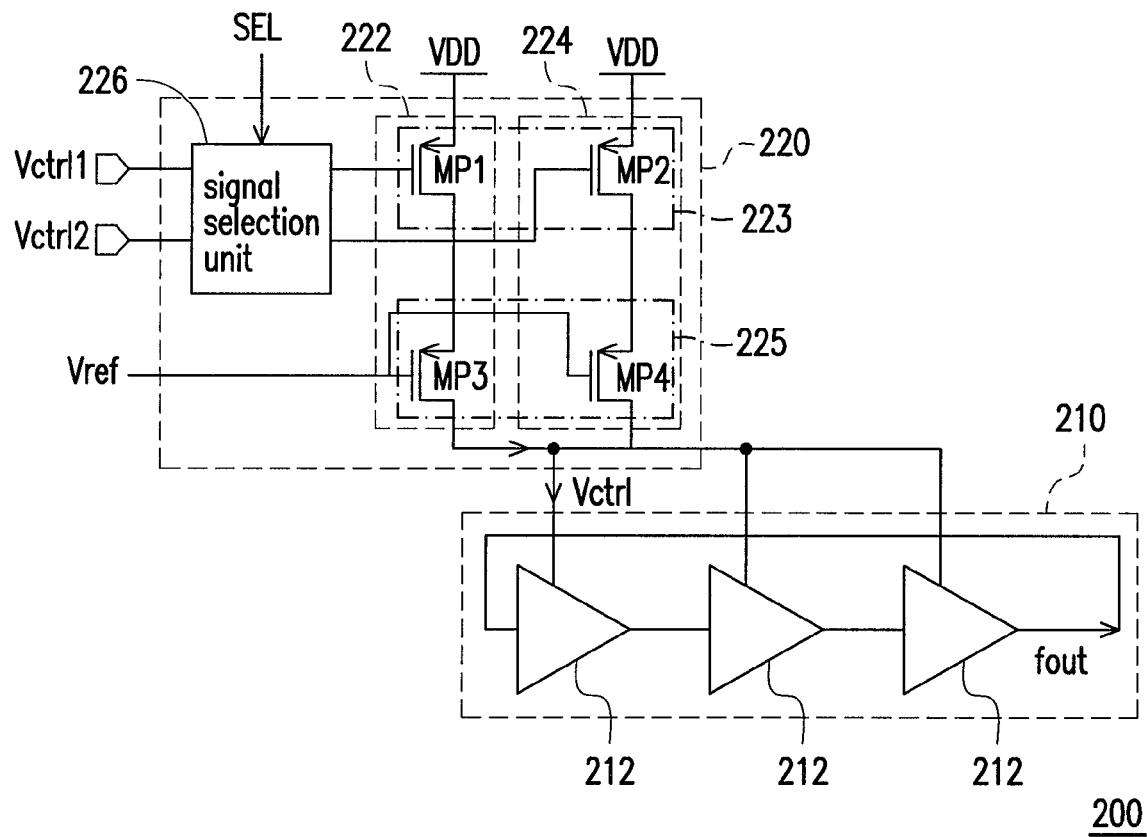
FIG. 5 is a detailed circuit diagram illustrating the voltage-controlled oscillator module of FIG. 2A.

FIG. 5 is a detailed circuit diagram illustrating the voltage-controlled oscillator module of FIG. 2A. Referring to FIG. 5, the voltage-controlled oscillator unit 210 includes a plurality of unit delay devices 212 that are coupled in series. An input end of each of the unit delay devices 212 is coupled to an output end of another unit delay device 212 at a previous stage, whereas an output end of each of the unit delay devices 212 is coupled to an input end of another unit delay device 212 at a rear stage, an output end of the last unit delay device 212 being coupled to an input end of the first unit delay device 212, such that a ring oscillator structure is formed. In another exemplary embodiment, the voltage-controlled oscillator unit 210 may also be a Colpitts oscillator, Hartley oscillator, inductance-capacitance (LC) oscillator or other types of voltage-controlled oscillator. The disclosure is not limited thereto. In this embodiment, the voltage-controlled oscillator unit 210 generates the frequency signal fout based on the control voltage Vctrl provided by the gain adjustment unit 220. Therefore, when the control voltage Vctrl is adjusted with a change of the first adjustment voltage Vctrl1 and the second adjustment voltage Vctrl2, the frequency value of the frequency signal fout is also changed accordingly.

In this embodiment, the gain adjustment unit 220 may include a first adjustment unit 222, a second adjustment unit 224, and a signal selection unit 226. The signal selection unit 226 receives the first adjustment voltage Vctrl1 and the second adjustment voltage Vctrl2, and is controlled by a selection signal SEL, so as to output the first adjustment voltage Vctrl1 to the first adjustment unit 222, output the second adjustment voltage Vctrl2 to the second adjustment unit 224, or respectively output the first adjustment voltage Vctrl1 and the second adjustment voltage Vctrl2 to the first adjustment unit 222 and the second adjustment unit 224 at the same time. In this embodiment, the memory controller 304 controls the signal selection unit 226 by the selection signal SEL based on a type of the transmission interface, so as to allow the signal selection unit 226 outputting the first adjustment voltage Vetrl1 or the second adjustment voltage Vetrl2 to a circuit at the next stage. Alternatively, when the voltage-controlled oscillator module is controlled under a dual-path structure (i.e. the voltage-controlled oscillator module may simultaneously receive a coarse-tuning control signal and a fine-tuning control signal to adjust an output frequency of the voltage-controlled oscillator module), the signal selection unit 226 simultaneously outputs the first adjustment voltage Vetrl1 and the second adjustment voltage Vctrl2. It should be noted that in an exemplary embodiment in which the voltage-controlled oscillator module is controlled under a dual-path structure, the signal selection unit 226 may be optionally implemented.

In this embodiment, implementation of the signal selection unit 226 may, for example, include a plurality of switches controlled by the selection signal SEL, or include a multiple-choice selector controlled by the selection signal SEL. In addition, although this embodiment describes coupling of the signal selection unit 226 between the adjustment voltage and adjustment unit for an exemplary illustration, the disclosure is not limited thereto. In another embodiment, the signal selection unit 226 may also be coupled between a unit voltage VDD and the adjustment unit, so as to determine whether the unit voltage VDD is provided to the first adjustment unit 222 and the second adjustment unit 224 to adjust the control voltage Vctrl.

The first adjustment unit 222 provides the control voltage Vctrl to the voltage-controlled oscillator unit 210 based on the first adjustment voltage Vctrl1 and a reference voltage Vref. The second adjustment unit provides the control voltage Vctrl to the voltage-controlled oscillator unit 210 based on the second adjustment voltage Vctrl2 and the reference voltage Vref.

Specifically, the first adjustment unit 222 includes an adjustment transistor MP1 and a reference transistor MP3. A first end of the adjustment transistor MP1 is coupled to a unit voltage VDD, a second end of the adjustment transistor MP1 is coupled to a first end of the reference transistor MP3, and a control end of the adjustment transistor MP1 is coupled to the first adjustment voltage Vetrl1. The reference transistor MP3 is cascode coupled to the adjustment transistor MP1. The first end of the reference transistor MP3 is coupled to the second end of the adjustment transistor MP1, a second end of the reference transistor MP3 is coupled to the voltage-controlled oscillator unit 210, and a control end of the reference transistor MP3 is coupled to the reference voltage Vref. The unit voltage VDD is converted into the control voltage Vctrl through the adjustment transistor MP1 and the reference transistor MP3, so as to be provided to the voltage-controlled oscillator unit 210.

As previously described, a designer may select the adjustment transistors MP1 with different width-to-length ratios to change the slope of the voltage-frequency curve C1 of the frequency value of the frequency signal fout and the voltage value of the first adjustment voltage Vctrl1 to meet design needs in practice. After the width-to-length ratio of channel of the adjustment transistor MP1 is set, a voltage stress between the first end and the second end of the adjustment transistor MP1 is controlled by the first adjustment voltage Vetrl1. Therefore, the first adjustment voltage Vetrl1 may adjust the control voltage Vctrl provided to the voltage control oscillator 210, so as to adjust the frequency value of the frequency signal fout. In addition, configuring the reference transistor MP3 may further reduce an influence of Early effect on the control voltage Vctrl. In addition, the reference transistor MP3 may be configured to reduce an influence of a change of the voltage stress between the first end and the second end of the adjustment transistor MP1 on the frequency signal fout. Namely, an influence of noise (e.g. ripple voltage) carried by an input voltage on the frequency signal fout is reduced. The input voltage here refers to the unit voltage VDD.

Similar to a circuit structure of the first adjustment unit 222, the second adjustment unit 224 includes an adjustment transistor MP2 and a reference transistor MP4. In this embodiment, since a voltage stress between a first end and a second end of the adjustment transistor MP2 is controlled by the second adjustment voltage Vctrl2, an adjustment to the control voltage Vctrl may also be achieved by adjusting the second adjustment voltage Vctrl2 in this embodiment. In addition, in this embodiment, the second voltage-frequency curve of the frequency value of the frequency signal fout and the voltage value of the second adjustment voltage Vctrl2 changes in response to the width-to-length ratio of channel of the adjustment transistor MP2.

From a different perspective, the gain adjustment unit 220 of this embodiment may include the adjustment circuit unit 223 and the reference circuit unit 225. The adjustment circuit unit 223 is coupled to the unit voltage VDD and configured to receive the first adjustment voltage Vctrl1 or the second adjustment voltage Vctrl2, so as to control the control voltage Vctrl. In this embodiment, the adjustment circuit unit 223 includes the adjustment transistors MP1 and MP2, whose operation has been disclosed above and is not reiterated hereinafter. In addition, the reference circuit unit 225 is coupled to the adjustment circuit unit 223 to receive the reference voltage Vref, thereby adjusting the control voltage Vctrl to reduce an influence of the change of the unit voltage VDD on the frequency signal fout. In this embodiment, the adjustment circuit unit 223 includes the reference transistors MP3 and MP4, whose operation has been disclosed above and is not reiterated hereinafter.

Therefore, in an embodying configuration of the disclosure, when the memory storage device 300 is coupled to the host 10 via SATA generation 1, the circuit operates at a lower frequency, and the memory controller 304 selects the first adjustment voltage Vctrl1 to adjust the frequency value of the frequency signal fout. In another embodying configuration of the disclosure, when the memory storage device 300 is coupled to the host 10 via SATA generation 3, the circuit operates at a higher frequency, and the memory controller 304 selects the second adjustment voltage Vetrl2 to adjust the frequency value of the frequency signal fout. Namely, when the memory storage device 300 is coupled to different hosts, the memory controller 304 may select an appropriate voltage adjustment path in correspondence to different transmission interfaces of different hosts.

Figure 6:
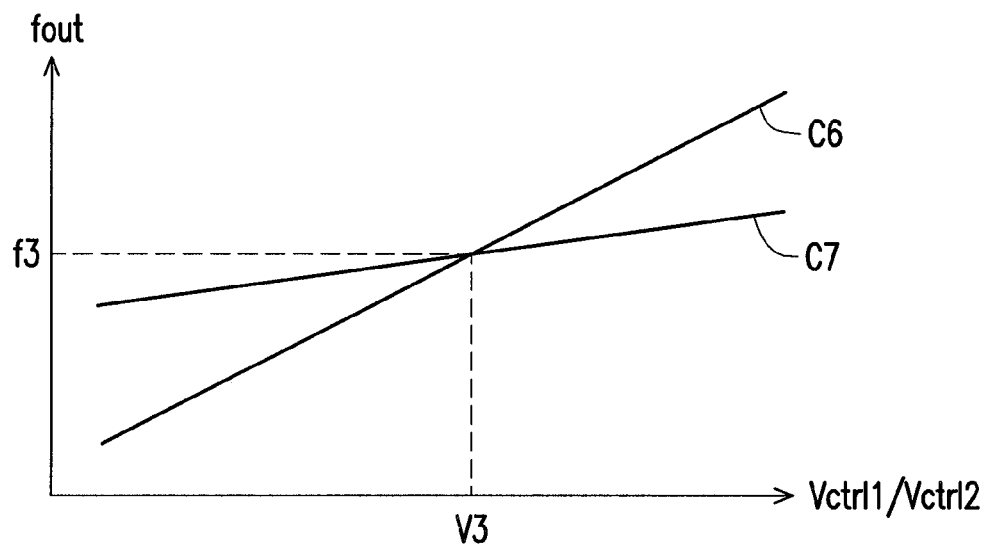
FIG. 6 illustrates voltage-frequency curves of the first and second adjustment voltages of the voltage-controlled oscillator module of FIG. 5.

FIG. 6 illustrates voltage-frequency curves of the first and second adjustment voltages of the voltage-controlled oscillator module of FIG. 5. Referring to FIG. 6, in FIG. 6, unbroken curves C6 and C7 are respectively the first voltage-frequency curve and the second voltage-frequency curve of the adjustment transistors MP1 and MP2 having different width-to-length ratios. By observing FIG. 6, it can be known that given a circuit design structure in FIG. 5, a third voltage value V3 of the first adjustment voltage Vctrl1 reflects a third frequency value f3 of the frequency signal fout through the first voltage-frequency curve C6, and the third voltage value V3 of the second adjustment voltage Vctrl2 reflects the same third frequency value f3 through the second voltage-frequency curve C7. In other words, the first frequency curve C6 and the second frequency curve C7 have at least one intersecting point. The intersecting point is an operating point of the voltage-controlled oscillator module. It should be noted that an operating voltage of the voltage-controlled oscillator module is not necessarily set at the intersecting point of different voltage-frequency curves. In the exemplary embodiment of the disclosure, even configured with adjustment transistors with different width-to-length ratios, the voltage-controlled oscillator module 200 still has a relatively wider dynamic range of voltage, and an adjustment to voltage frequency may be relatively stable instead of being drastic.

Figure 7:
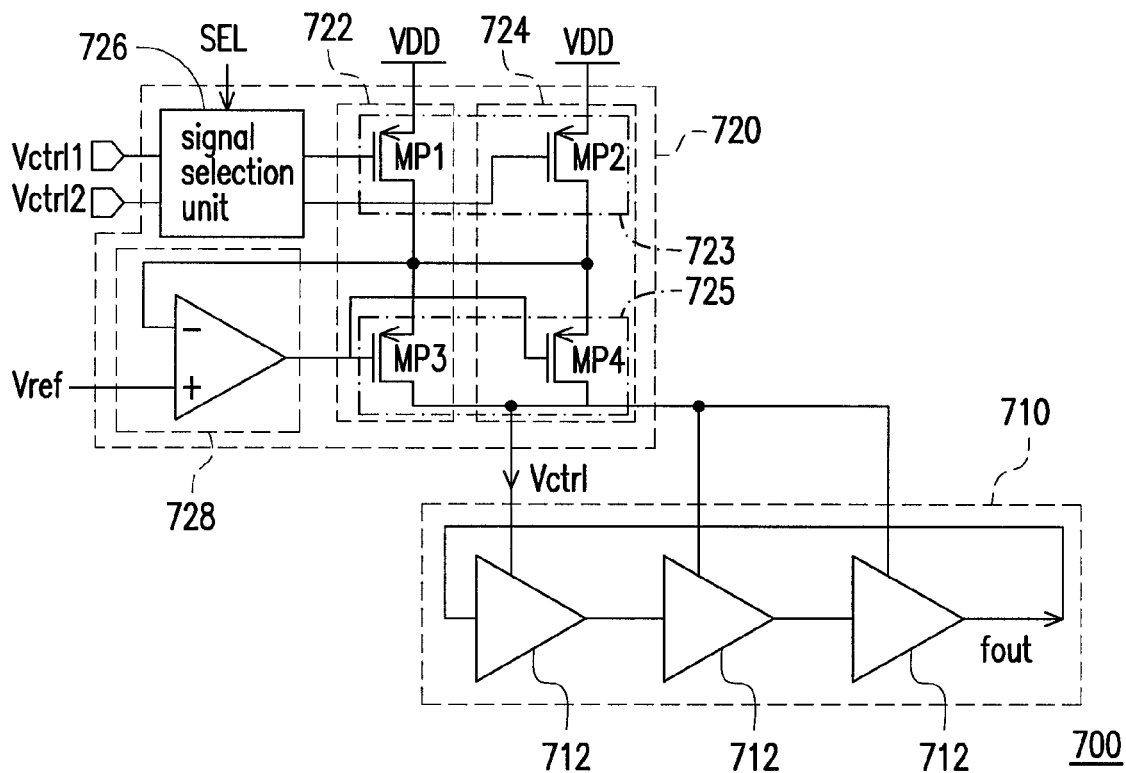
FIG. 7 is a detailed circuit diagram illustrating a voltage-controlled oscillator module according to another embodiment of the disclosure.

FIG. 7 is a detailed circuit diagram illustrating a voltage-controlled oscillator module according to another embodiment of the disclosure. Referring to FIGS. 5 and 7, a voltage-controlled oscillator module 700 of this embodiment is similar to the voltage-controlled oscillator module 200, with a primary difference therebetween, such as a gain adjustment unit 720 further includes an operational amplifier 728.

Specifically, an inverting input end (−) of the operational amplifier 728 is coupled to the first ends of the reference transistors MP3 and MP4, a non-inverting input end of the operational amplifier 728 is coupled to the reference voltage Vref, and an output end of the operational amplifier 728 is coupled to the control ends of the reference transistors MP3 and MP4. In this embodiment, configuring the operational amplifier 728 may maintain the voltage stress between the first and second ends of the adjustment transistors MP1 and MP2 unchanged, so as to improve a power supply rejection ratio (PSRR) of the voltage-controlled oscillator module.

From a different perspective, the gain adjustment unit 720 of this embodiment may include an adjustment circuit unit 723 and a reference circuit unit 725. The adjustment circuit unit 723 is coupled to the unit voltage VDD to receive the first adjustment voltage Vetrl1 or the second adjustment voltage Vctrl2, so as to control the control voltage Vctrl. In this embodiment, the adjustment circuit unit 723 includes the adjustment transistors MP1 and MP2, whose operation has been disclosed above and is not reiterated hereinafter. In addition, the reference circuit unit 725 is coupled to the adjustment circuit unit 723 to receive the reference voltage Vref, so as to adjust the control voltage Vctrl, thereby reducing an influence of change of the unit voltage VDD on the frequency signal fout. In this embodiment, the adjustment circuit unit 723 includes the reference transistors MP3 and MP4, whose operation has been disclosed above and is not reiterated hereinafter.

In addition, the description of the embodiments of FIGS. 2 to 6 has provided sufficient teachings, suggestions, and embodiments to the operation and characteristics of the voltage-controlled oscillator module 700 that are similar to the operation and characteristics of the voltage-controlled oscillator module 200, so further reiteration is not provided hereinafter.

Figure 8:
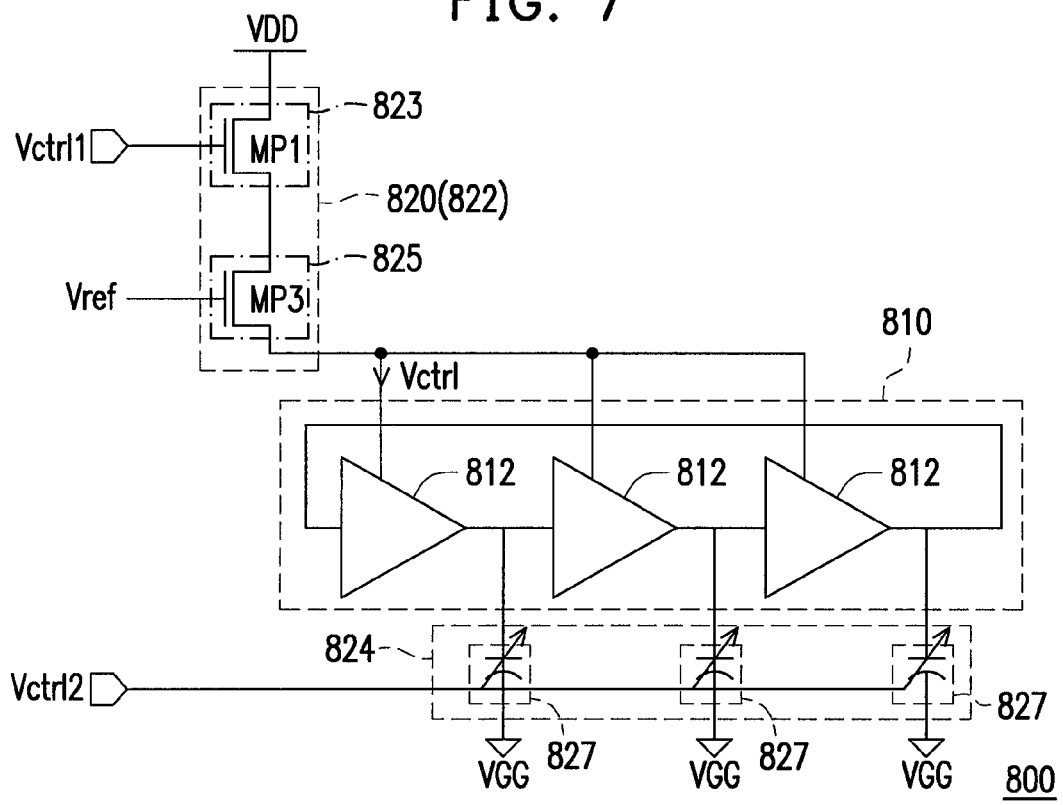
FIG. 8 is a detailed circuit diagram illustrating a voltage-controlled oscillator module according to another embodiment of the disclosure.

FIG. 8 is a detailed circuit diagram illustrating a voltage-controlled oscillator module according to another embodiment of the disclosure. Referring to FIGS. 5 and 8, a voltage-controlled oscillator module 800 of this embodiment is similar to the voltage-controlled oscillator module 200, with a primary difference therebetween, such as an adjustment capacitance unit 824. Specific description is provided below.

In this embodiment, the structure of the second adjustment unit is implemented as the adjustment capacitance unit 824 that includes a plurality of varactors 827. One end of each of the varactors 827 is coupled to an output end of a corresponding unit delay device 812, whereas another end of each of the varactors 827 is coupled to a ground voltage VGG. A capacitance value of each of the varactors 827 is adjusted based on the second adjustment voltage Vctrl2, so as to provide the control voltage Vctrl to a voltage-controlled oscillator unit 810. Therefore, the control voltage Vctrl here serves as a terminal voltage at the end of the varactor 827 coupled to the unit delay device 812, or a voltage stress between the two ends of the varactor 827. Based on a circuit design structure of FIG. 4, the adjustment capacitance unit 810 may perform a fine control on the frequency signal fout.

With respect to a first adjustment unit 822, viewing from another perspective, the first adjustment unit 822 of this embodiment serves as a gain adjustment 820, which includes an adjustment circuit unit 823 and a reference circuit unit 825. The adjustment circuit unit 823 is coupled to the unit voltage VDD to receive the first adjustment voltage Vetrl1 or the second adjustment voltage Vctrl2, so as to control the control voltage Vctrl. In this embodiment, the adjustment circuit unit 823 includes the adjustment transistor MP1, whose operation has been disclosed above and is not reiterated hereinafter. In addition, the reference circuit unit 825 is coupled to the adjustment circuit unit 823 to receive the reference voltage Vref, thereby adjusting the control voltage Vctrl to reduce an influence of the change of the unit voltage VDD on the frequency signal fout. In this embodiment, the adjustment circuit unit 823 includes the reference transistor MP3, whose operation has been disclosed above and is not reiterated hereinafter.

In addition, the description of the embodiments of FIGS. 2 to 6 has provided sufficient teachings, suggestions, and embodiments to the operation and characteristics of the voltage-controlled oscillator module 800 that are similar to the operation and characteristics of the voltage-controlled oscillator module 200, so further reiteration is not provided hereinafter.

Figure 9:
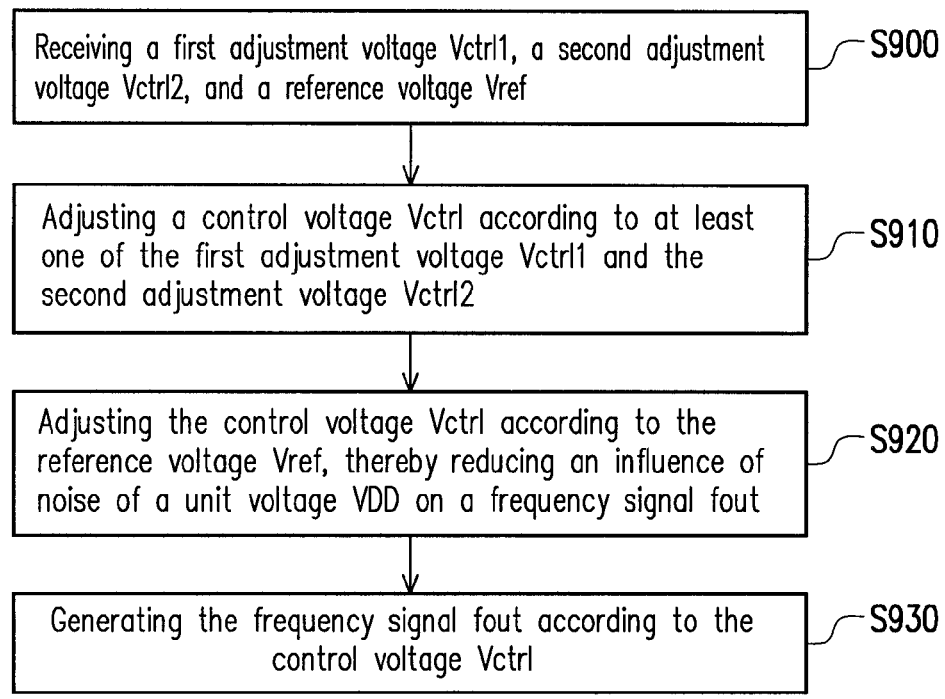
FIG. 9 is a flowchart illustrating a method for adjusting signal frequency according to an embodiment of the disclosure.

FIG. 9 is a flowchart illustrating a method for adjusting signal frequency according to an embodiment of the disclosure. Referring to FIGS. 2 and 9 simultaneously, a method for adjusting signal frequency is, for example, suitable for any voltage-controlled oscillator module disclosed in the above exemplary embodiments. The method is described below. At step S900, the gain adjustment 220 receives a first adjustment voltage Vctrl1, a second adjustment voltage Vctrl2, and a reference voltage Vref. Then, at step S910, the gain adjustment unit 220 adjusts a control voltage Vctrl according to at least one of the first adjustment voltage Vctrl1 and the second adjustment voltage Vetrl2. Then, at step S920, the gain adjustment unit 220 adjusts the control voltage Vctrl according to the reference voltage Vref, so as to reduce an influence of noise of a unit voltage VDD on a frequency signal fout. Then, at step 930, the voltage-controlled oscillator unit 201 generates the frequency signal fout according to the control voltage Vctrl. A first voltage-frequency curve of a frequency value of the frequency signal fout and a voltage value of the first adjustment voltage Vctrl1 changes in response to a structure characteristic of the adjustment circuit unit 223.

In addition, the embodiments of FIGS. 2A to 8 provide sufficient teachings, suggestions, and description of embodiments for the method for adjusting signal frequency in the embodiment of the disclosure, so further reiteration is not provided herein.

Figure 10:
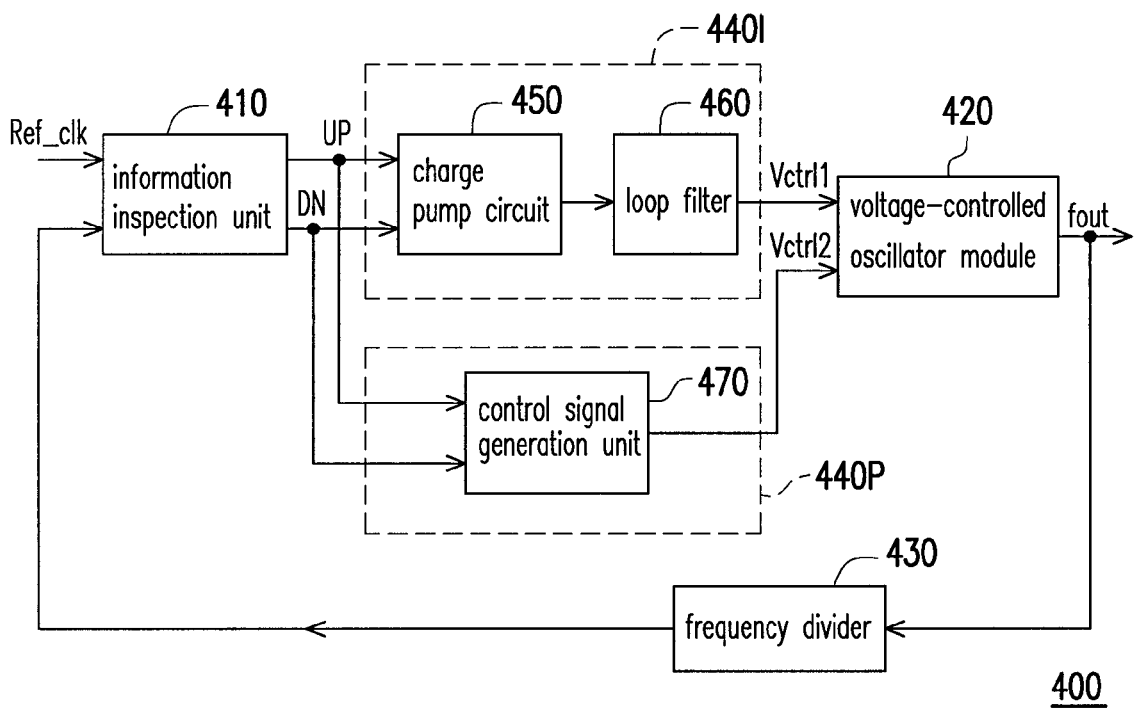
FIG. 10 is a detailed circuit diagram illustrating a phase-locked loop according to an embodiment of the disclosure.

FIG. 10 is a detailed circuit diagram illustrating a phase-locked loop according to an embodiment of the disclosure. Referring to FIG. 10, a phase-locked loop system 400 of the exemplary embodiment includes a phase-locked loop and a control signal generation unit 470. In this embodiment, the phase-locked loop includes an information inspection unit 410, a charge pump (CP) circuit 450, a loop filter (LP) 460, a voltage-controlled oscillator module 420, and a frequency divider 430. In this embodiment, a specific embodiment of the voltage-controlled oscillator module 420 is, for example, any voltage-controlled oscillator module disclosed in the above exemplary embodiments.

The phase-locked loop outputs a frequency signal fout as a phase lock clock and controls the voltage-controlled oscillator module 420 based on a dual-path structure, and the dual-path structure includes a first path 440P and a second path 440I. In this exemplary embodiment, the first path may be a coarse-tuning path, such as a proportional path (i.e. a path passing the charge pump 450), and the second path may be a fine-tuning path, such as an integral path (i.e. a path not passing the charge pump 450). In addition, in this embodiment, the voltage-controlled oscillator module 420 may be a crystal oscillator, a ring oscillator, or a LC oscillator, etc., which may be manufactured with a manufacturing process of metal oxide semiconductor (MOS) transistor.

Specifically, the phase-locked loop has two input ends respectively receiving a reference frequency as a reference clock Ref_clk and receiving a feedback frequency. The feedback frequency is a feedback signal of the phase-locked loop. Generally speaking, a feedback is generated after an appropriate frequency reduction. The information inspection unit 410 receives the two input signals, compares a difference between the reference frequency and the feedback frequency, and inspects a magnitude of deviation in phase and frequency. When the reference frequency is higher than the feedback frequency, an output end of the information inspection unit 410 outputs an up signal UP to the first path 440P and the second path 440I. Alternatively, if the reference frequency is lower than the feedback frequency, another output end of the information detection unit 410 outputs a down signal DN.

In the first path 440P, the control signal generation unit 470 is coupled to the phase-locked loop and is configured on the first path 440P. In addition, the second adjustment voltage Vctrl2 is provided according to the up signal UP and the down signal DN of the phase-locked loop, so as to control the frequency signal fout output by the voltage-controlled oscillator module 420. In the second path 440I, the information inspection unit 410 is, for example, a phase detector. The up signal UP and the down signal DN generated by the information inspection unit 410 are configured to control the charge pump circuit 450 and the loop filter 460 to generate the first adjustment voltage Vctrl1, so as to control the frequency signal fout output by the voltage-controlled oscillator module 420 at the next stage. Therefore, the voltage-controlled oscillator module 420 adjusts the frequency value of the frequency signal according to the first adjustment voltage Vctrl1 and the second adjustment voltage Vetrl2, and feedbacks to the information inspection unit 410 for a phase-locking loop operation. However, according to an operating frequency of the information inspection unit 410, the frequency of the frequency signal fout may undergo frequency reduction by the frequency divider 430 before being fed back to the information inspection unit 410. Here, the frequency divider 430 may be optionally configured based on design needs in practice. A locking mechanism is to feed the output frequency signal fout back to the information inspection unit 410, so as to reach a state in which the phase and frequency are synchronized with the reference frequency, for example. A phase loop is locked when a feedback input frequency and a reference input frequency are consistent in frequency and phase.

Based on the above, in the exemplary embodiments of the disclosure, the voltage-frequency curve between the frequency signal and the adjustment voltage changes in response to the structure characteristic of the adjustment circuit unit. Therefore, the voltage-frequency curve according to the exemplary embodiments of the disclosure has the characteristics of a wide dynamic range and a flat change of Therefore, according to the voltage-frequency curve, the gain adjustment unit utilizes the adjustment voltage to adjust the frequency value of the frequency signal generated by the voltage-controlled oscillator unit. Therefore, the voltage-controlled oscillator module may adjust the frequency value of the frequency signal by adjusting the voltage according to different transmission interfaces to which the voltage-controlled oscillator module is coupled.

The previously described exemplary embodiments of the present invention have many advantages, including a voltage-controlled oscillator module, whose signal frequency is adjusted according to a transmission interface to which the voltage-controlled oscillator module is coupled, wherein the advantages aforementioned not required in all versions of the invention.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A voltage-controlled oscillator module, comprising:
a voltage-controlled oscillator unit, configured to generate a frequency signal according to a control voltage; and
a gain adjustment unit, coupled to the voltage-controlled oscillator unit and configured to receive a first adjustment voltage, a second adjustment voltage, and a reference voltage, thereby adjusting the control voltage to adjust a frequency value of the frequency signal,
wherein the gain adjustment unit comprises:
an adjustment circuit unit, comprising:
a first adjustment unit, configured to receive the first adjustment voltage and the reference voltage, thereby adjusting the control voltage to adjust the frequency value of the frequency signal based on a first voltage- frequency curve between the frequency value of the frequency signal and a voltage value of the first adjustment voltage; and
a second adjustment unit, configured to receive the second adjustment voltage and the reference voltage, thereby adjusting the control voltage to adjust the frequency value of the frequency signal based on a second voltage-frequency curve between the frequency value of the frequency signal and a voltage value of the second adjustment voltage, wherein the first voltage-frequency curve is different from the second voltage-frequency curve; and
a reference circuit unit, coupled to the first adjustment unit and the second adjustment unit and configured to receive the reference voltage, thereby adjusting the control voltage to reduce an influence of noise of the unit voltage on the frequency signal.

2. The voltage-controlled oscillator module as claimed in claim 1, wherein the voltage-controlled oscillator module is configured to couple to a host by a transmission interface, and the adjustment circuit unit is configured to adjust the control voltage based on at least one of the first adjustment voltage and the second adjustment voltage according to a type of the transmission interface.

3. The voltage-controlled oscillator module as claimed in claim 1, wherein the gain adjustment unit further comprises:
a signal selection unit, configured to receive the first adjustment voltage and the second adjustment voltage and controlled by a selection signal, so as to output at least one of the first adjustment voltage and the second adjustment voltage to the adjustment circuit unit.

4. The voltage-controlled oscillator module as claimed in claim 3, wherein the voltage-controlled oscillator module is configured to couple to a host by a transmission interface, and the voltage-controlled oscillator module is disposed in a memory storage device, the memory storage device is coupled to the host and comprises a memory controller, and the memory controller is configured to control the signal selection unit with the selection signal to allow the signal selection unit outputting at least one of the first adjustment voltage and the second adjustment voltage to the adjustment circuit unit according to a type of the transmission interface.

5. The voltage-controlled oscillator module as claimed in claim 1, wherein the adjustment circuit unit comprises:
a first adjustment transistor, having a first end, a second end, and a control end, the first end of the first adjustment transistor being coupled to the unit voltage, and the control end of the first adjustment transistor being configured to receive the first adjustment voltage.

6. The voltage-controlled oscillator module as claimed in claim 5, wherein the reference circuit unit comprises:
a first reference transistor, coupled to the first adjustment transistor, the first reference transistor having a first end, a second end, and a control end, the first end of the first reference transistor being coupled to the second end of the first adjustment transistor, the second end of the first reference transistor being coupled to the voltage-controlled oscillator unit, and the control end of the first reference transistor being configured to receive the reference voltage,
wherein the unit voltage is converted into the control voltage through the first adjustment transistor and the first reference transistor, so as to be provided to the voltage-controlled oscillator unit.

7. The voltage-controlled oscillator module as claimed in claim 5, wherein the adjustment circuit unit further comprises:

a second adjustment transistor, having a first end, a second end, and a control end, the first end of the second adjustment transistor being coupled to the unit voltage, and the control end of the second adjustment transistor being configured to receive the second adjustment voltage, wherein a structure characteristic of the second adjustment transistor is different from that of the first adjustment transistor.

8. The voltage-controlled oscillator module as claimed in claim 7, wherein the reference circuit unit further comprises:
a second reference transistor, coupled to the second adjustment transistor, the second reference transistor having a first end, a second end, and a control end, the first end of the second reference transistor being coupled to the second end of the second adjustment transistor, the second end of the second reference transistor being coupled to the voltage-controlled oscillator unit, and the control end of the second reference transistor being coupled to the reference voltage,
wherein the unit voltage is converted into the control voltage through the second adjustment transistor and the second reference transistor, so as to be provided to the voltage-controlled oscillator unit.

9. The voltage-controlled oscillator module as claimed in claim 1, wherein the gain adjustment unit further comprises:
an operational amplifier, having a first input end, a second input end, and an output end, the first input end and the output end of the operational amplifier being coupled to the reference circuit unit, the second input end of the operational amplifier being coupled to the reference voltage, and the output end of the operational amplifier being configured to provide the reference voltage to the reference circuit unit.

10. The voltage-controlled oscillator module as claimed in claim 5, wherein the voltage-controlled oscillator unit comprises a plurality of unit delay devices coupled in series, the gain adjustment unit further comprises:
an adjustment capacitance unit, comprising a plurality of varactors, one end of each of the varactors being coupled to an output end of the corresponding unit delay device, and another end of each of the varactors being coupled to a ground voltage,
wherein a capacitance value of each of the varactors is adjusted based on the second adjustment voltage, so as to provide the control voltage to the voltage-controlled oscillator unit.

11. The voltage-controlled oscillator module as claimed in claim 7, wherein each of the first and second adjustment transistors is a metal oxide semiconductor field effect transistor, and the structure characteristic is a width-to-length ratio of channel of the metal oxide semiconductor field effect transistor.

12. A method for adjusting frequency signal of a voltage-controlled oscillator module, wherein the voltage-controlled oscillator module comprises an adjustment circuit unit coupled to a unit voltage, the method for adjusting frequency signal comprises:
receiving a first adjustment voltage, a second adjustment voltage, and a reference voltage;
adjusting a control voltage according to at least one of the first adjustment voltage based on a first voltage-frequency curve between the frequency value of the frequency signal and a voltage value of the first adjustment voltage;
adjusting the control voltage according to the second adjustment voltage based on a second voltage-frequency curve between the frequency value of the frequency signal and a voltage value of the second adjustment voltage, wherein the first voltage-frequency curve is different from the second voltage-frequency curve;

adjusting the control voltage according to the reference voltage, so as to reduce an influence of noise of the unit voltage on a frequency signal; and generating the frequency signal according to the control voltage.

13. The method for adjusting frequency signal as claimed in claim 12, wherein the voltage-controlled oscillator module is configured to couple to a host by a transmission interface, and in an operation for adjusting the control voltage according to at least one of the first adjustment voltage and the second adjustment voltage, at least one of the first adjustment voltage and the second adjustment voltage is selected to adjust the control voltage.

14. A frequency generating system, comprising:
a phase-locked loop, configured to generate a frequency signal according to a reference frequency and a feedback signal, and output the frequency signal as the feedback signal, wherein the phase-locked loop comprises a voltage-controlled oscillator module, and the voltage-controlled oscillator module receives a first adjustment voltage generated inside the phase-locked loop; and a control signal generation unit, coupled to the phase-locked loop and configured to provide a second adjustment voltage to the voltage-controlled oscillator module according to a up signal and a down signal of the phase-locked loop, wherein the voltage-controlled oscillator module comprises:

a voltage-controlled oscillator unit, configured to generate the frequency signal according to a control voltage; and a gain adjustment unit, coupled to the voltage-controlled oscillator unit and configured to receive the first adjustment voltage, the second adjustment voltage, and a reference voltage, thereby adjusting the control voltage to adjust a frequency value of the frequency signal, wherein the gain adjustment unit comprises:
an adjustment circuit unit, comprising:
a first adjustment unit, configured to receive the first adjustment voltage and the reference voltage, thereby adjusting the control voltage to adjust the frequency value of the frequency signal based on a first voltage-frequency curve between the frequency value of the frequency signal and a voltage value of the first adjustment voltage; and a second adjustment unit, configured to receive the second adjustment voltage and the reference voltage, thereby adjusting the control voltage to adjust the frequency value of the frequency signal based on a second voltage-frequency curve between the frequency value of the frequency signal and a voltage value of the second adjustment voltage, wherein the first voltage-frequency curve is different from the second voltage-frequency curve; and a reference circuit unit, coupled to the first adjustment unit and the second adjustment unit and configured to receive the reference voltage, thereby adjusting the control voltage to reduce an influence of noise of the unit voltage on the frequency signal.

15. The frequency generating system as claimed in claim 14, wherein the voltage-controlled oscillator module is configured to couple to a host by a transmission interface, and the adjustment circuit unit is configured to adjust the control voltage based on at least one of the first adjustment voltage and the second adjustment voltage according to a type of the transmission interface.

16. The frequency generating system as claimed in claim 14, wherein the gain adjustment unit further comprises:
a signal selection unit, configured to receive the first adjustment voltage and the second adjustment voltage and controlled by a selection signal, so as to output at least one of the first adjustment voltage and the second adjustment voltage to the adjustment circuit unit.

17. The frequency generating system as claimed in claim 16, wherein the voltage-controlled oscillator module is configured to couple to a host by a transmission interface, and the voltage-controlled oscillator module is disposed in a memory storage device, the memory storage device is coupled to the host and comprises a memory controller, and the memory controller is configured to control the signal selection unit with the selection signal to allow the signal selection unit outputting the first adjustment voltage or the second adjustment voltage to the adjustment circuit unit according to a type of the transmission interface.

18. The frequency generating system as claimed in claim 14, wherein the adjustment circuit unit comprises:
a first adjustment transistor, having a first end, a second end, and a control end, the first end of the first adjustment transistor being coupled to the unit voltage, and the control end of the first adjustment transistor being configured to receive the first adjustment voltage.

19. The frequency generating system as claimed in claim 18, wherein the reference circuit unit comprises:
a first reference transistor, coupled to the first adjustment transistor, the first reference transistor having a first end, a second end, and a control end, the first end of the first reference transistor being coupled to the second end of the first adjustment transistor, the second end of the first reference transistor being coupled to the voltage-controlled oscillator unit, and the control end of the first reference transistor being configured to receive the reference voltage, wherein the unit voltage is converted into the control voltage through the first adjustment transistor and the first reference transistor, so as to be provided to the voltage-controlled oscillator unit.

20. The frequency generating system as claimed in claim 18, wherein the adjustment circuit unit further comprises:
a second adjustment transistor, having a first end, a second end, and a control end, the first end of the second adjustment transistor being coupled to the unit voltage, and the control end of the second adjustment transistor being configured to receive the second adjustment voltage, wherein a structure characteristic of the second adjustment transistor is different from that of the first adjustment transistor.

21. The frequency generating system as claimed in claim 20, wherein the reference circuit unit further comprises:
a second reference transistor, coupled to the second adjustment transistor, the second reference transistor having a first end, a second end, and a control end, the first end of the second reference transistor being coupled to the second end of the second adjustment transistor, the second end of the second reference transistor being coupled to the voltage-controlled oscillator unit, and the control end of the second reference transistor being coupled to the reference voltage, wherein the unit voltage is converted into the control voltage through the second adjustment transistor and the second reference transistor, so as to be provided to the voltage-controlled oscillator unit.

22. The frequency generating system as claimed in claim 14, wherein the gain adjustment unit further comprises:
an operational amplifier, having a first input end, a second input end, and an output end, the first input end and the output end of the operational amplifier being coupled to the reference circuit unit, the second input end of the operational amplifier being coupled to the reference voltage, and the output end of the operational amplifier being configured to provide the reference voltage to the reference circuit unit.

23. The frequency generating system as claimed in claim 18, wherein the voltage-controlled oscillator unit comprises a plurality of unit delay devices coupled in series, the gain adjustment unit further comprises:
an adjustment capacitance unit, comprising a plurality of varactors, one end of each of the varactors being coupled to an output end of the corresponding unit delay device, and another end of each of the varactors being coupled to a ground voltage,
wherein a capacitance value of each of the varactors is adjusted based on the second adjustment voltage, so as to provide the control voltage to a voltage-controlled oscillator unit.

24. The frequency generating system as claimed in claim 20, wherein each of the first and second adjustment transistors is a metal oxide semiconductor field effect transistor, and the structure characteristic is a width-to-length ratio of channel of the metal oxide semiconductor field effect transistor.

* * * * *